(12) United States Patent
Suzuki et al.

(10) Patent No.: US 10,923,404 B2
(45) Date of Patent: *Feb. 16, 2021

(54) INSPECTION METHOD, INSPECTION DEVICE, AND MARKING FORMING METHOD

(71) Applicant: HAMAMATSU PHOTONICS K.K., Hamamatsu (JP)

(72) Inventors: Shinsuke Suzuki, Hamamatsu (JP); Akira Shimase, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/742,382

(22) Filed: Jan. 14, 2020

(65) Prior Publication Data

US 2020/0152525 A1 May 14, 2020

Related U.S. Application Data

(63) Continuation of application No. 16/478,192, filed as application No. PCT/JP2017/035848 on Oct. 2, 2017, now Pat. No. 10,586,743.

(30) Foreign Application Priority Data

Jan. 19, 2017 (JP) .................... 2017-007383

(51) Int. Cl.
*H01L 21/66* (2006.01)
*G01R 31/28* (2006.01)
(Continued)

(52) U.S. Cl.
CPC .......... *H01L 22/12* (2013.01); *G01R 31/2836* (2013.01); *H01L 21/268* (2013.01);
(Continued)

(58) Field of Classification Search
None
See application file for complete search history.

(56) References Cited

U.S. PATENT DOCUMENTS

| 10,586,743 B2* | 3/2020 | Suzuki .............. H01L 21/67259 |
| 2013/0113497 A1* | 5/2013 | Suzuki ................. G01R 31/311 |
| | | 324/525 |

(Continued)

FOREIGN PATENT DOCUMENTS

| JP | 2011-200897 A | 10/2011 |
| JP | 2012-97391 A | 5/2012 |

(Continued)

OTHER PUBLICATIONS

Tonnies, D., Muller, D., "Laser Marking Meets Diverse Challenges in Fab and Packaging", Solid State Technology, p. 27 Aug./Sep. 2017. (Year: 2017).

(Continued)

*Primary Examiner* — J. E. Schoenholtz
(74) *Attorney, Agent, or Firm* — Faegre Drinker Biddle & Reath LLP

(57) ABSTRACT

An inspection method according to an embodiment is an inspection method of performing laser marking on a semiconductor device (D) including a substrate (SiE) and a metal layer (ME) formed on the substrate (SiE), and the inspection method includes specifying a fault point (fp) in the semiconductor device (D) by inspecting the semiconductor device (D), and irradiating the semiconductor device (D) with laser light having a wavelength that is transmitted through the substrate (SiE) from the substrate (SiE) side so that a marking is formed at least at a boundary between the substrate (SiE) and the metal layer (ME) on the basis of the fault point (fp).

14 Claims, 10 Drawing Sheets

(51) Int. Cl.
*H01L 21/268* (2006.01)
*H01L 21/67* (2006.01)
*H01L 23/544* (2006.01)

(52) U.S. Cl.
CPC .. *H01L 21/67115* (2013.01); *H01L 21/67259* (2013.01); *H01L 23/544* (2013.01)

(56) References Cited

U.S. PATENT DOCUMENTS

2015/0253241 A1    9/2015   Kaneoka
2018/0131048 A1    5/2018   Kwak et al.

FOREIGN PATENT DOCUMENTS

JP    2013-101009 A    5/2013
JP    2016-148550 A    8/2016

OTHER PUBLICATIONS

International Preliminary Report on Patentability (IPRP) dated Aug. 1, 2019 that issued in WO Patent Application No. PCT/JP2017/035848.

\* cited by examiner

Fig.8
(a)
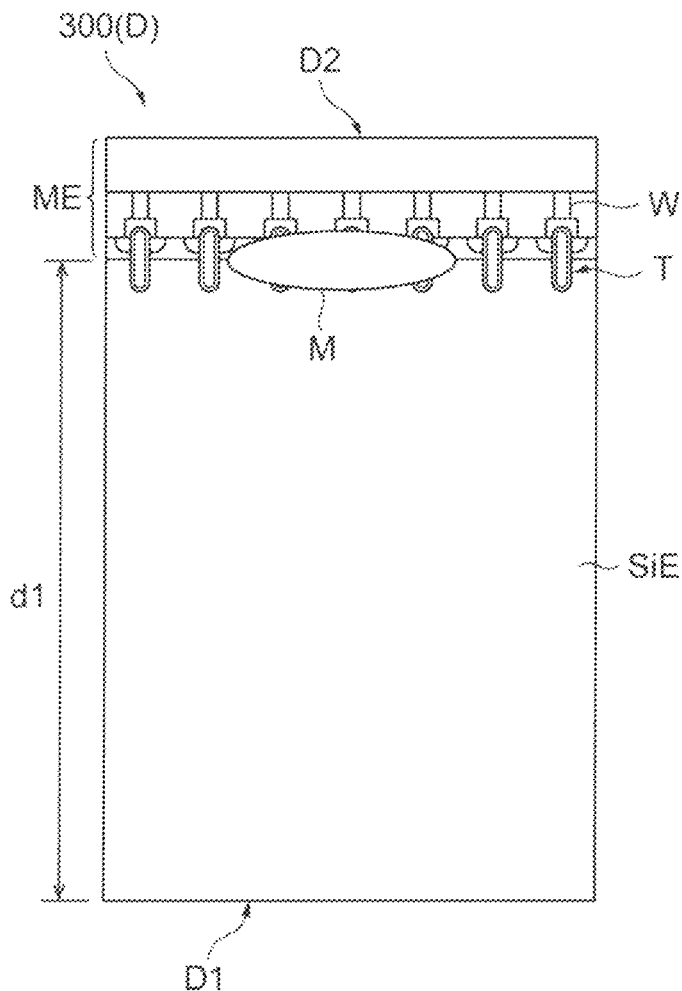
(b)
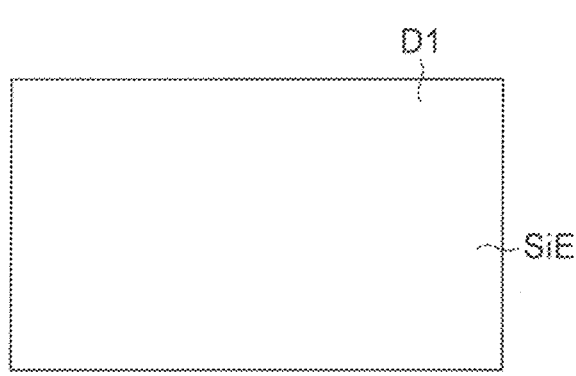

Fig.9
(a)
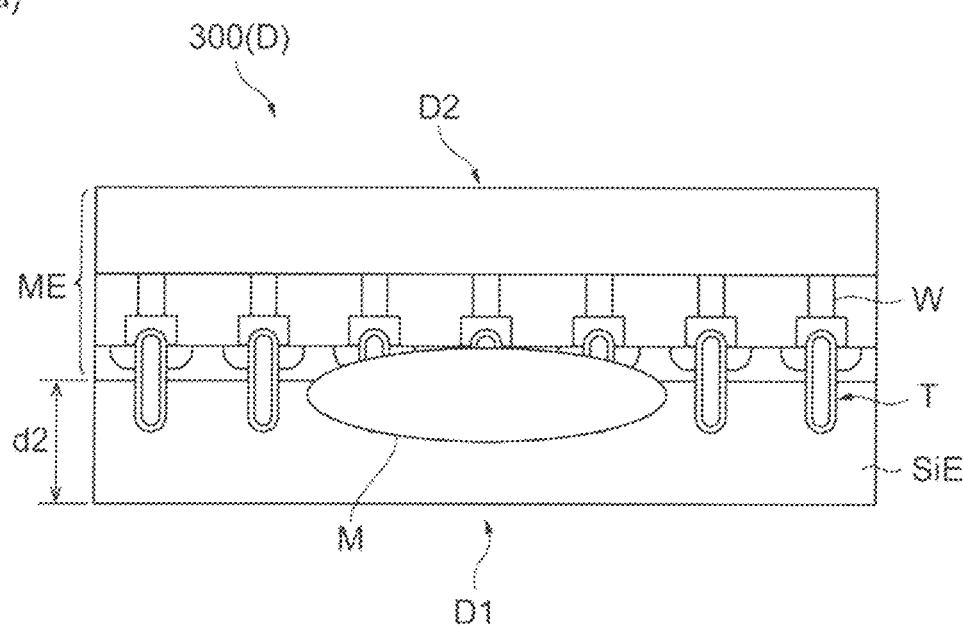
(b)
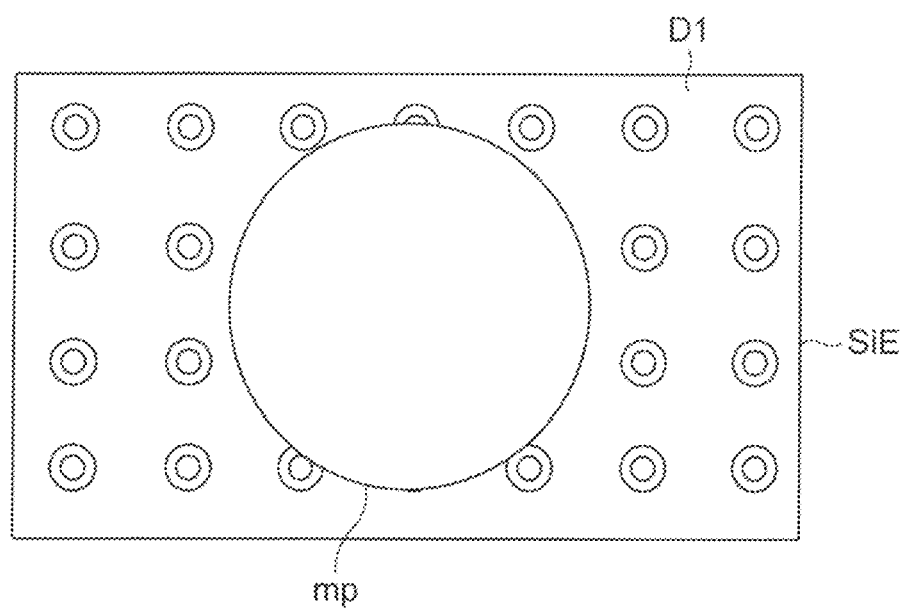

Fig.10 (a)
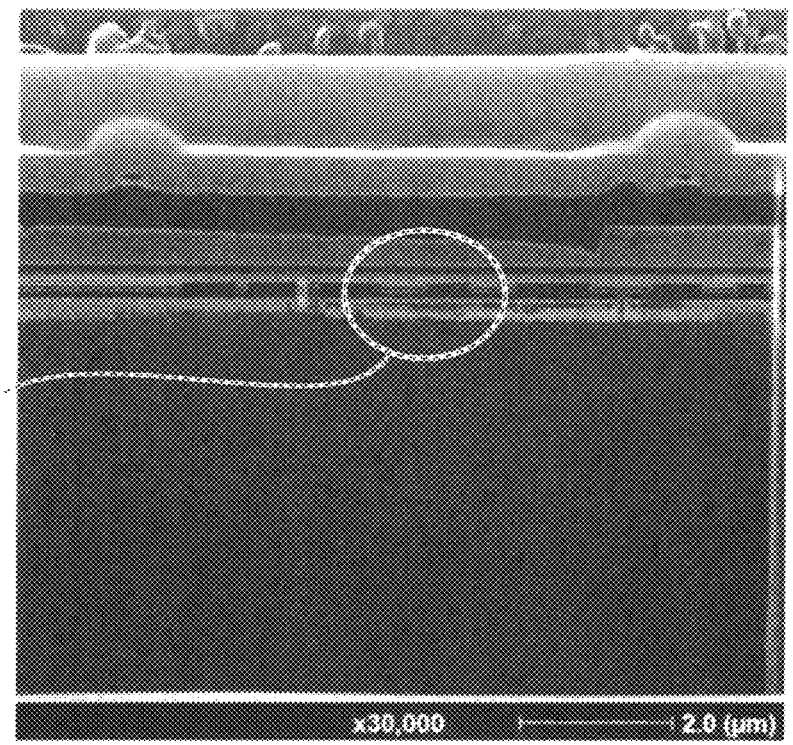
(b)
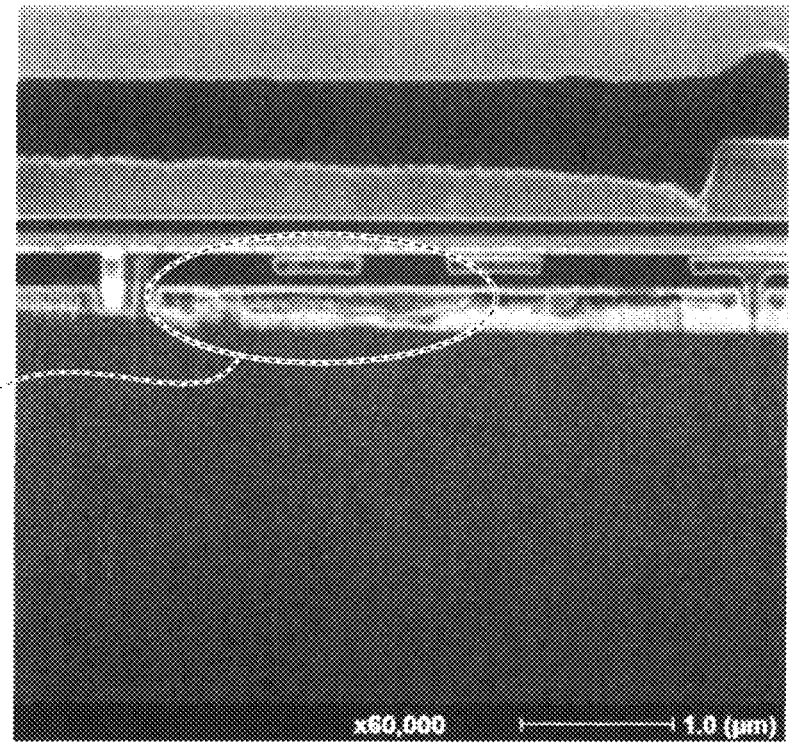

INSPECTION METHOD, INSPECTION DEVICE, AND MARKING FORMING METHOD

TECHNICAL FIELD

An aspect of the present invention relates to a semiconductor device inspection method, an inspection device, and a marking forming method.

BACKGROUND ART

As a technique of inspecting a semiconductor device, there is a technique of performing marking through irradiation with laser light at several places around a fault point when a fault point has been specified. Such a technique is a highly effective technique because the technique allows a fault point to be readily ascertained using marking in a post-process in fault analysis.

In a case in which marking is performed on, for example, a packaged sample (a semiconductor device), and a sample in which it is necessary to use a probe card without a window on the metal layer side, the sample cannot be irradiated with laser light from the front surface side (the metal layer side), and therefore, it is necessary to irradiate the sample with laser light from the back surface side (the substrate side). For example, Patent Literature 1 discloses a fault analysis device that analyzes a fault position in a semiconductor device in which an SiC substrate is used, using an optical beam induced resistance change (OBIRCH) method. Patent Literature 1 discloses that irradiation is performed with laser light from the back surface side and laser marking is performed on a device and a circuit on the front surface side of the substrate.

CITATION LIST

Patent Literature

[Patent Literature 1] Japanese Unexamined Patent Publication No. 2012-97391

SUMMARY OF INVENTION

Technical Problem

However, Patent Literature 1 does not disclose a detailed position of the marking. Further, when physical analysis of a semiconductor device is performed on the basis of the marking, a position of the marking may be confirmed from the front surface side or the position of the marking may be confirmed from the back surface side. Therefore, it is preferable for a position at which the marking is formed to be a position that can be easily confirmed from both the front surface side and the back surface side.

Therefore, an object of an aspect of the present invention is to provide an inspection method capable of allowing a marking position to be confirmed from both the front surface side and the back surface side at the time of physical analysis when laser marking is performed from a substrate side of a semiconductor device, an inspection device, and a marking forming method.

Solution to Problem

An inspection method according to an aspect of the present invention is an inspection method of performing laser marking on a semiconductor device including a substrate and a metal layer formed on the substrate, the inspection method including: specifying a predetermined position in the semiconductor device by inspecting the semiconductor device; and irradiating the semiconductor device with laser light having a wavelength that is transmitted through the substrate from the substrate side so that a marking is formed at least at a boundary between the substrate and the metal layer on the basis of the predetermined position.

In this inspection method, the semiconductor device is irradiated with laser light having a wavelength transmitted through the substrate from the substrate side so that the marking is formed at least at the boundary between the substrate and the metal layer on the basis of a predetermined position (for example, a fault point) specified in the semiconductor device. It is possible to form the marking at a position at which the marking can be easily confirmed from both the front surface side (the metal layer side) and the back surface side (the substrate side) by forming the marking at the boundary between the substrate and the metal layer. Accordingly, when laser marking is performed from the substrate side of the semiconductor device, it is possible to easily confirm the marking position from both the front surface side and the back surface side at the time of physical analysis.

The irradiating the semiconductor device with laser light may include controlling the irradiation with laser light so that the marking does not penetrate the metal layer. Accordingly, the marking can be kept inside the semiconductor device. As a result, it is possible to prevent the front surface of the semiconductor device from being contaminated due to debris of the semiconductor device that may be generated at the time of marking formation.

The irradiating the semiconductor device with laser light may include controlling the irradiation with the laser light so that at least one of cavities, reforming, and melting is generated as the marking. Accordingly, it is possible to appropriately form the marking.

The inspection method may further include acquiring a pattern image of the semiconductor device including a mark image indicating the marking. Accordingly, it is possible to acquire a pattern image from which the marking position can be visually ascertained together with the pattern (for example, a wiring pattern) of the semiconductor device. With such a pattern image, it becomes possible to easily ascertain the marking position in the physical analysis.

The inspection method may further include acquiring position information for specifying a position of the marking on the basis of the pattern image; and outputting the position information. Accordingly, it is possible to output the marking position information for specifying the marking position in the physical analysis to an external device or the like. Therefore, for example, even in a case in which the inspection device that performs marking and the analysis device that performs physical analysis are disposed in different places, it is possible to appropriately transfer the marking position information necessary to perform physical analysis to the analysis device.

The acquiring the position information may include acquiring information indicating a relative position of the marking with reference to a feature point of the semiconductor device as the position information. It is possible to accurately ascertain the position of the marking by using the relative position of the marking with respect to a position of the feature point (for example, a groove portion of a wiring pattern) of the semiconductor device as position information.

The inspection method may further include thinning the substrate after the irradiating the semiconductor device with the laser light, and observing the semiconductor device from the thinned substrate side. It is possible to easily confirm the position of the marking in the observation step by thinning the substrate. Accordingly, it is possible to accurately perform the physical analysis on the basis of the position of the marking.

An inspection device according to an aspect of the present invention is an inspection device that performs laser marking on a semiconductor device including a substrate and a metal layer formed on the substrate, the inspection device including: an observation optical system configured to transfer light from the substrate side of the semiconductor device; a photodetector configured to detect light from the semiconductor device via the observation optical system and output a detection signal; a laser light source configured to output laser light having a wavelength that is transmitted through the substrate; a marking optical system configured to irradiate the semiconductor device with the laser light output by the laser light source from the substrate side; and a marking control unit configured to control an output of the laser light source so that a marking is formed at least on a boundary between the substrate and the metal layer on the basis of a predetermined position that is specified on the basis of the detection signal.

In this inspection method, the semiconductor device is irradiated with laser light having a wavelength transmitted through the substrate from the substrate side so that the marking is formed at least at the boundary between the substrate and the metal layer on the basis of a predetermined position (for example, a fault point) specified in the semiconductor device. It is possible to form the marking at a position at which the marking can be easily confirmed from both of the front surface side (the metal layer side) and the back surface side (the substrate side) by forming the marking at the boundary between the substrate and the metal layer. Accordingly, when laser marking is performed from the substrate side of the semiconductor device, it is possible to easily confirm the marking position from both the front surface side and the back surface side at the time of physical analysis.

The marking control unit may control an output of the laser light source so that the marking does not penetrate through the metal layer. Accordingly, the marking can be kept inside the semiconductor device. As a result, it is possible to prevent the front surface of the semiconductor device from being contaminated due to debris of the semiconductor device that may be generated at the time of marking formation.

The marking control unit may control an output of the laser light source so that at least one of cavities, reforming, and melting is generated as the marking. Accordingly, it is possible to appropriately form the marking.

The inspection device may further include a processing unit configured to acquire a pattern image of the semiconductor device including a mark image indicating the marking on the basis of the detection signal. Accordingly, it is possible to acquire a pattern image from which the marking position can be visually ascertained together with the pattern (for example, a wiring pattern) of the semiconductor device. With such a pattern image, it becomes possible to easily ascertain the marking position in the physical analysis.

The processing unit may acquire position information for specifying the position of the marking on the basis of the pattern image, and output the position information. Accordingly, it is possible to output the marking position information for specifying the marking position in the physical analysis to an external device or the like. Therefore, for example, even in a case in which the inspection device that performs marking and the analysis device that performs physical analysis are disposed in different places, it is possible to appropriately transfer the marking position information necessary to perform physical analysis to the analysis device.

The processing unit may acquire information indicating a relative position of the marking with reference to a feature point of the semiconductor device as the position information. It is possible to accurately ascertain the position of the marking by using the relative position of the marking with respect to the position of the feature point (for example, a groove portion of a wiring pattern) of the semiconductor device as position information.

A marking forming method according to an aspect of the present invention is a marking forming method of performing laser marking on a semiconductor device including a substrate and a metal layer formed on the substrate, the marking forming method including: irradiating the semiconductor device with laser light having a wavelength that is transmitted through the substrate from the substrate side so that a marking is formed at least at a boundary between the substrate and the metal layer with respect to a predetermined position of the semiconductor device.

In this marking forming method, the semiconductor device is irradiated with laser light having a wavelength transmitted through the substrate from the substrate side so that the marking is formed at least at the boundary between the substrate and the metal layer. It is possible to form the marking at a position at which the marking can be easily confirmed from both the front surface side (the metal layer side) and the back surface side (the substrate side) by forming the marking at the boundary between the substrate and the metal layer. Accordingly, when laser marking is performed from the substrate side of the semiconductor device, it is possible to easily confirm the marking position from both the front surface side and the back surface side at the time of physical analysis.

The irradiating the semiconductor device with the laser light may include controlling the irradiation with the laser light so that the marking does not penetrate the metal layer. Accordingly, the marking can be kept inside the semiconductor device. As a result, it is possible to prevent the front surface of the semiconductor device from being contaminated due to debris of the semiconductor device that may be generated at the time of marking formation.

The irradiating the semiconductor device with the laser light may include controlling the irradiation with the laser light so that at least one of cavities, reforming, and melting is generated as the marking. Accordingly, it is possible to appropriately form the marking.

Advantageous Effects of Invention

According to an aspect of the present invention, it is possible to provide an inspection method capable of allowing a marking position to be easily confirmed from both the front surface side and the back surface side at the time of physical analysis when laser marking is performed from a substrate side of a semiconductor device, an inspection device, and a marking forming method.

Figure 2:
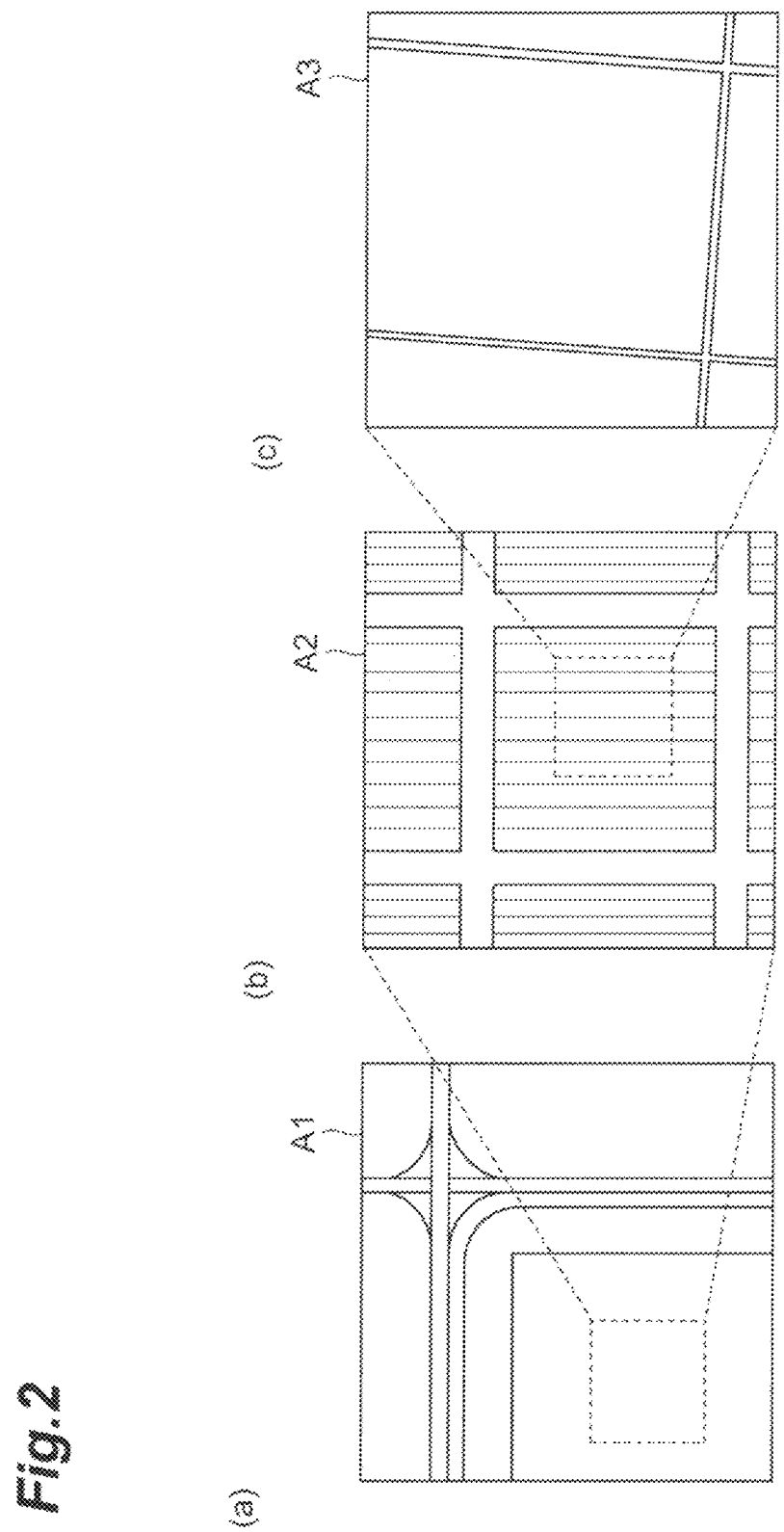

A portion (a) of FIG. 2 is a diagram illustrating an example of a pattern image with a low magnification, a portion (b) of FIG. 2 is a diagram illustrating an example of a pattern image with a medium magnification, and a portion (c) of FIG. 2 is a diagram illustrating an example of a pattern image with a high magnification.

Figure 3:
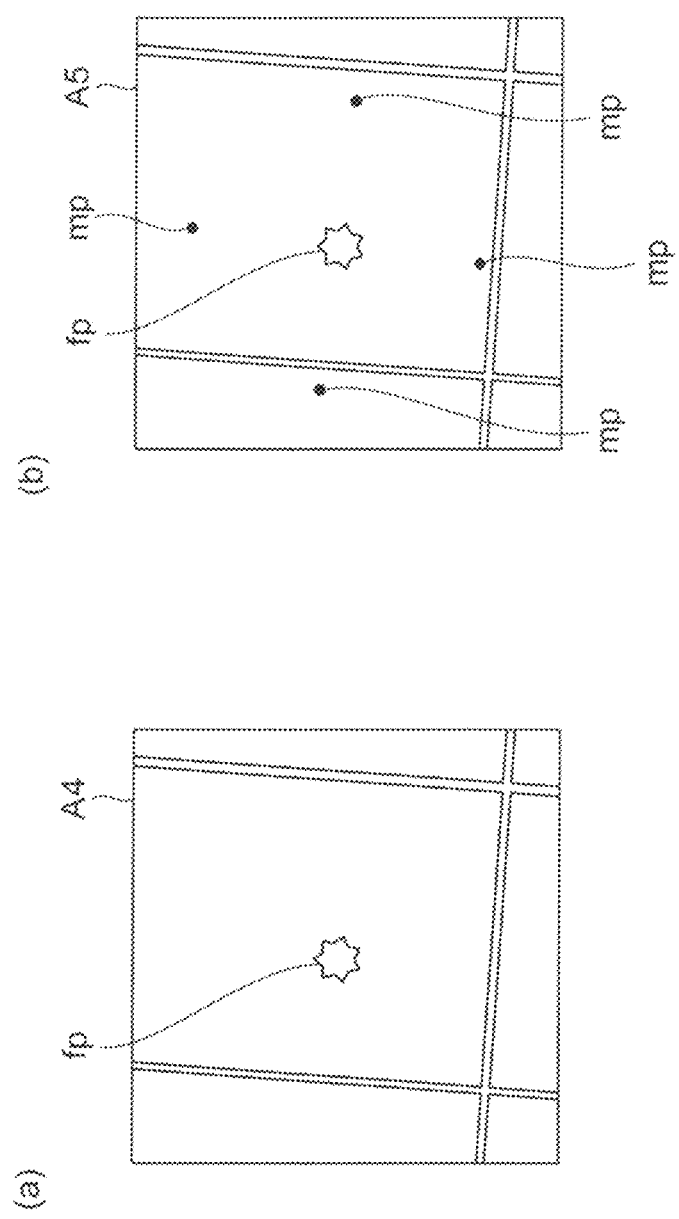

A portion (a) of FIG. 3 is a diagram illustrating an example of an analysis image and a portion (b) of FIG. 3 is a diagram illustrating an example of a reference image.

Figure 4:
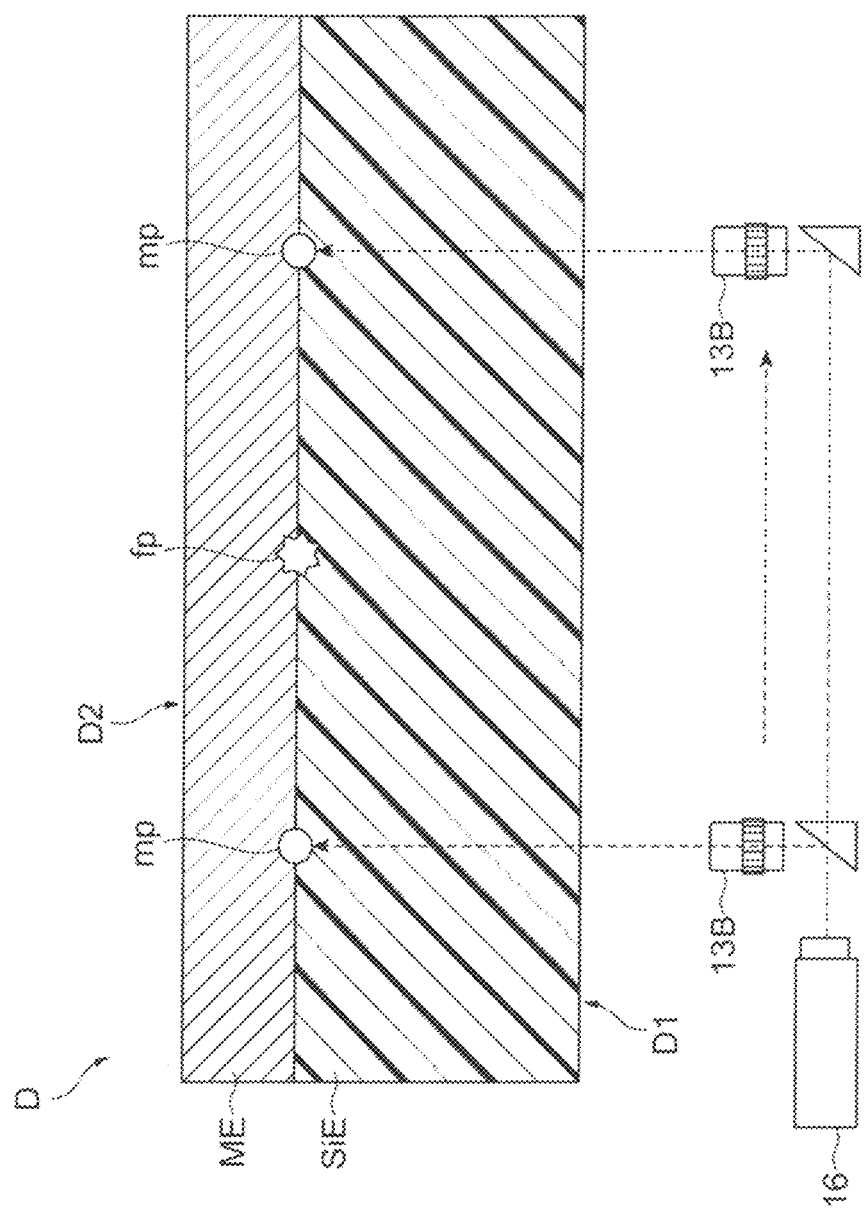

FIG. 4 is a schematic cross-sectional view of a laser marked semiconductor device.

Figure 5:
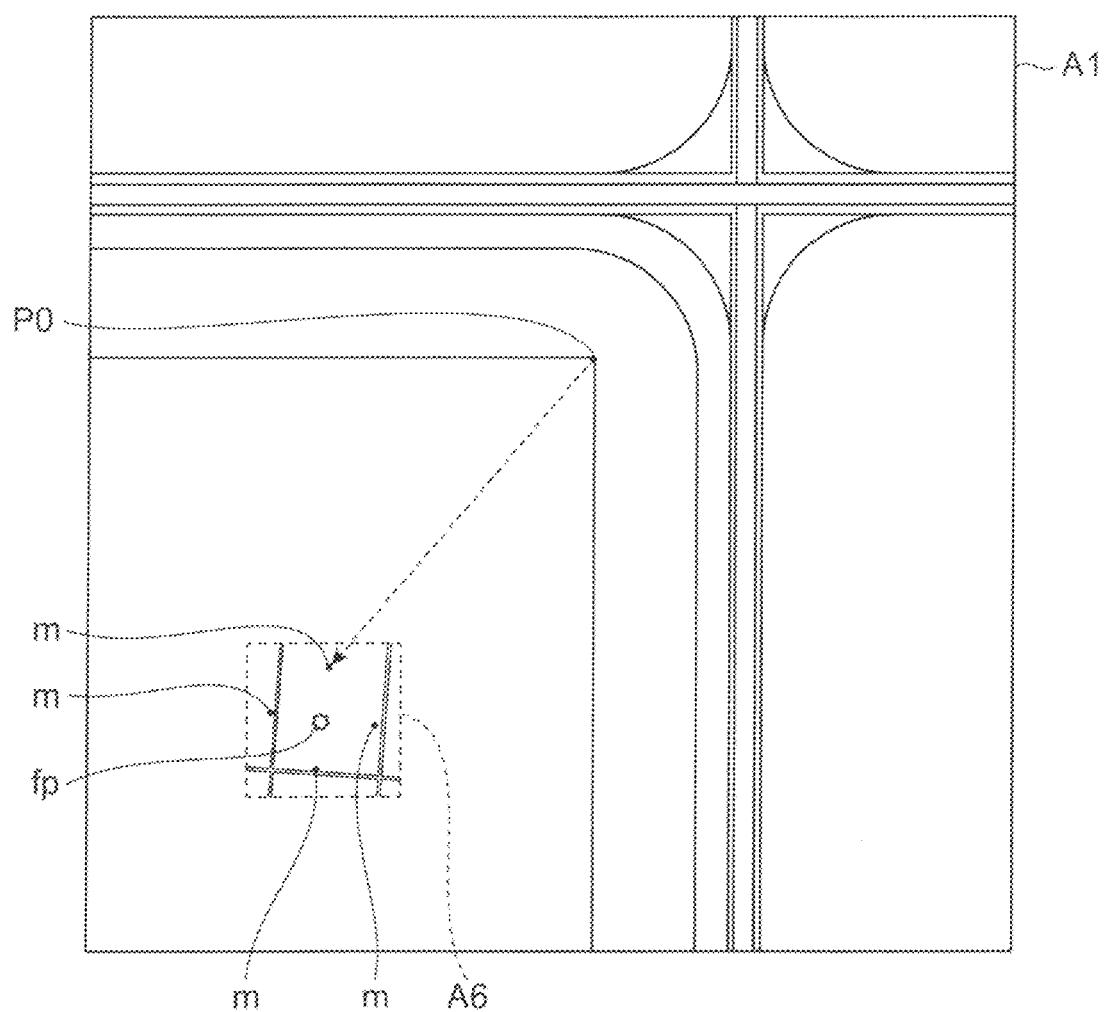

FIG. 5 is a diagram illustrating marking position information that is generated by an inspection device.

Figure 6:
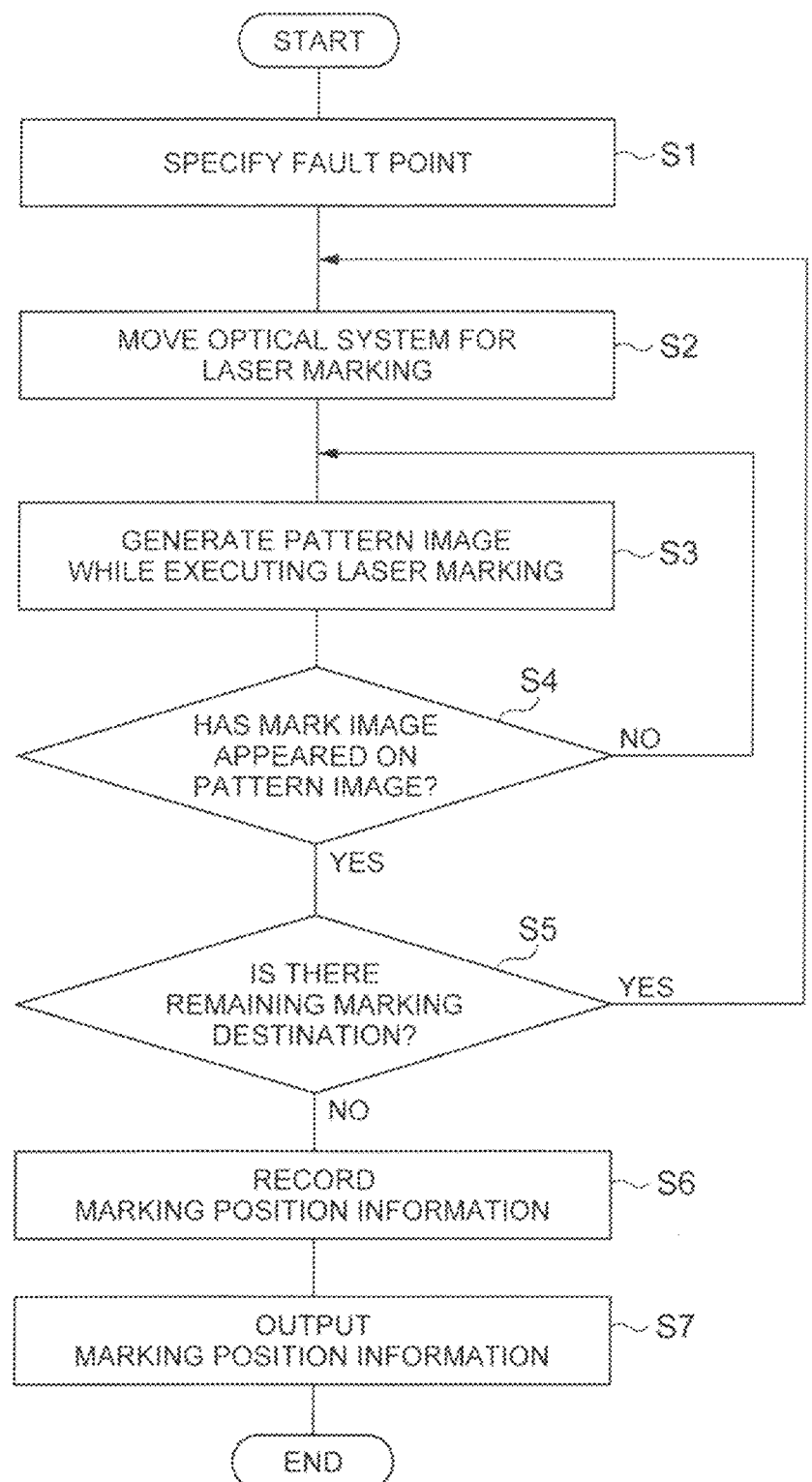

FIG. 6 is a flowchart illustrating an example of an operation of the inspection device.

Figure 7:
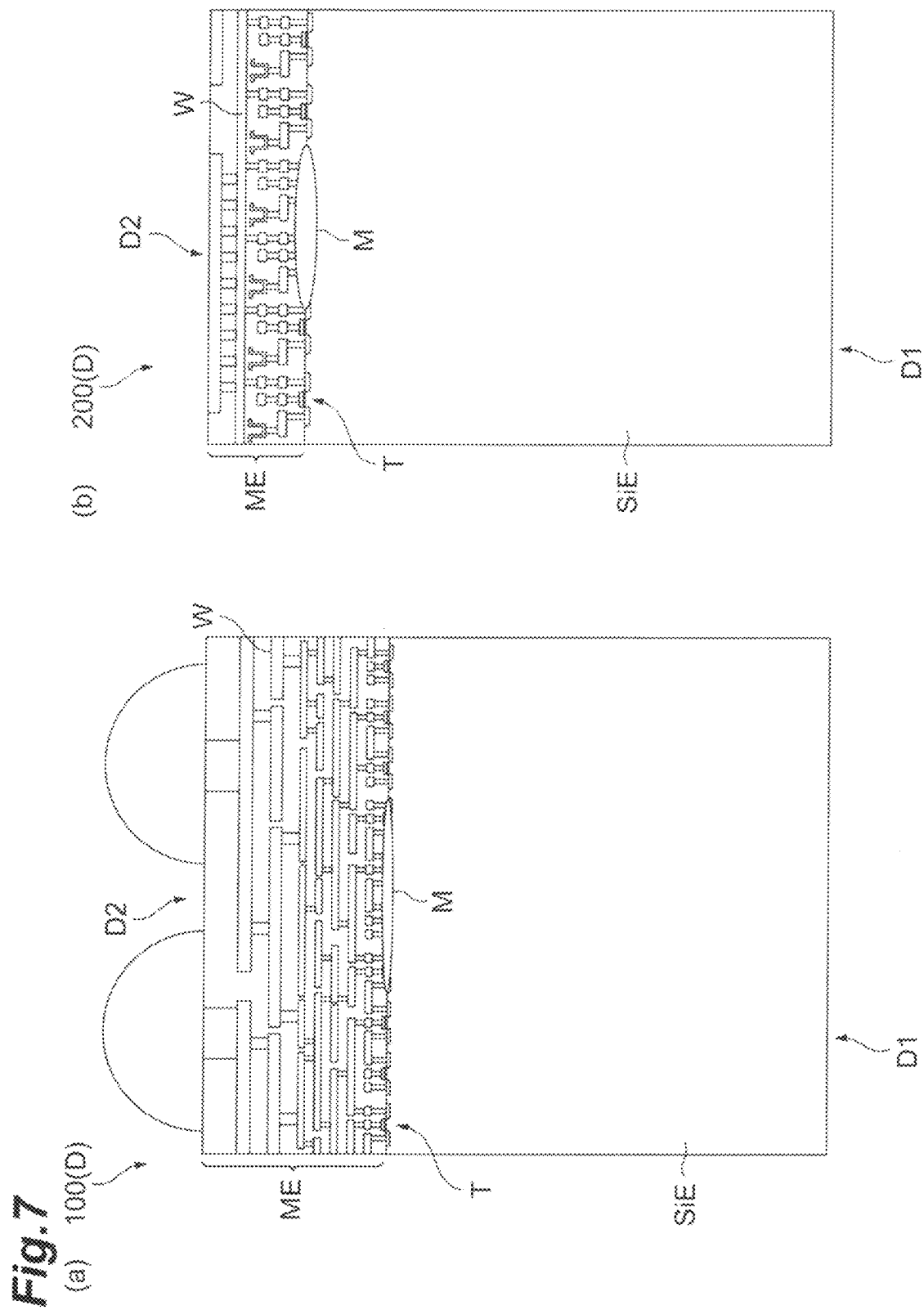

FIG. 7 is a diagram illustrating a configuration example of a semiconductor device, in which a portion (a) illustrates a schematic cross section of a logic device and a portion (b) illustrates a schematic cross section of a memory device.

FIG. 8 is a diagram illustrating an example of a semiconductor device, in which a portion (a) illustrates a schematic cross section of a power device and a portion (b) illustrates a bottom surface of a power device.

FIG. 9 is a diagram illustrating a state after a substrate of the power device in FIG. 8 is thinned, in which a portion (a) illustrates a schematic cross section of the power device, and a portion (b) illustrates a bottom surface of the power device.

A portion (a) of FIG. 10 is a diagram illustrating an example of an image with a low magnification obtained by imaging a cross-sectional portion including a marking in a semiconductor device using an SEM, and a portion (b) of FIG. 10 is a diagram illustrating an example of an image with a high magnification obtained by imaging a cross-sectional portion including a marking in a semiconductor device using an SEM.

DESCRIPTION OF EMBODIMENTS

Hereinafter, preferred embodiments of the present invention will be described in detail with reference to the accompanying drawings. It should be noted that in the description of the drawings, the same or corresponding elements are denoted by the same reference numerals, and redundant description is omitted.

Figure 1:
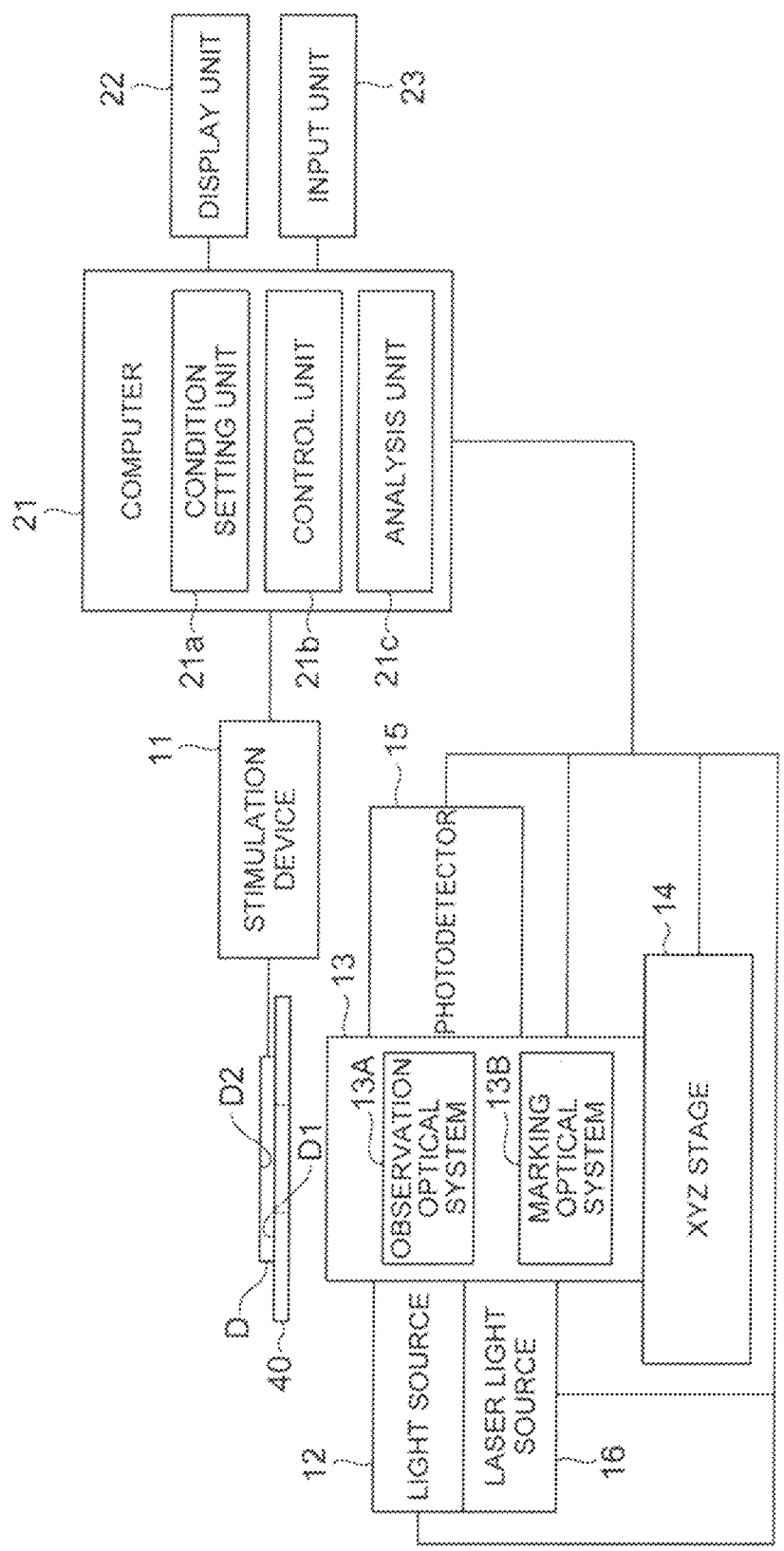
FIG. 1 is a configuration diagram of an inspection device according to an embodiment of the present invention.

As illustrated in FIG. 1, an inspection device 1 according to the embodiment is a device for inspecting a semiconductor device D which is a device under test (DUT), such as specifying a fault point (a predetermined position) in the semiconductor device D. More specifically, the inspection device 1 specifies a fault point and performs marking indicating the fault point around the fault point. With this marking, it is possible to easily ascertain the fault point specified by the inspection device 1 in a post-process (physical analysis) of fault analysis.

Examples of the semiconductor device D include a discrete semiconductor element (discrete), an optoelectronic element, a sensor/actuator, a logic large scale integration (LSI), a memory element, a linear integrated circuit (IC), and a combination thereof. The discrete semiconductor elements include a diode, a power transistor, or the like. The logic LSI includes a transistor having a metal-oxide-semiconductor (MOS) structure, a bipolar transistor, or the like. Further, the semiconductor device D may be a package including a semiconductor device, a composite substrate, or the like. The semiconductor device D includes a substrate, and a metal layer formed on the substrate. As the substrate of the semiconductor device D, for example, a silicon substrate is used. The semiconductor device D is placed on a sample stage 40.

The inspection device 1 performs a fault point specifying process for specifying a fault point of the semiconductor device D, and a marking process for performing marking indicating the fault point around the specified fault point. The inspection device 1 includes a stimulation device 11, a light source 12, an optical system 13 including an observation optical system 13A and a marking optical system 13B, an XYZ stage 14, a photodetector 15, a laser light source 16, a computer 21, a display unit 22, and an input unit 23.

First, functional configurations of the inspection device 1 related to the fault point specifying process will be described. The inspection device 1 includes a stimulation device 11, a light source 12, an observation optical system 13A, an XYZ stage 14, a photodetector 15, a computer 21, a display unit 22, and an input unit 23 as functional configurations related to the fault point specifying process.

The stimulation device 11 functions as a stimulation signal application unit that is electrically connected to the semiconductor device D via a cable and applies a stimulation signal to the semiconductor device D. The stimulation device 11 is, for example, a pulse generator that applies a stimulation signal to the semiconductor device D, a tester unit that inputs a test signal, and so on. The stimulation device 11 is operated by a power supply (not illustrated) and repeatedly applies a stimulation signal such as a predetermined test pattern to the semiconductor device D. The stimulation device 11 may be a stimulation device that applies a modulated current signal or may be a stimulation device that applies a direct current signal. The stimulation device 11 is electrically connected to the computer 21 via a cable and applies a stimulation signal such as a test pattern designated from the computer 21 to the semiconductor device D. It should be noted that the stimulation device 11 may not necessarily be electrically connected to the computer 21. When the stimulation device 11 is not electrically connected to the computer 21, the stimulation device 11 determines a stimulation signal such as a test pattern alone and applies the stimulation signal such as a test pattern to the semiconductor device D.

The light source 12 is operated by a power supply (not illustrated) and outputs light for illuminating the semiconductor device D. The light source 12 is a light emitting diode (LED), a lamp light source, or the like. A wavelength of the light output from the light source 12 is a wavelength that is transmitted through the substrate of the semiconductor device D. For example, when the substrate of the semiconductor device D is silicon, the wavelength is preferably 1064 nm or more. The light output from the light source 12 is guided to the observation optical system 13A.

The observation optical system 13A is an optical system that guides light from the substrate side of the semiconductor device D to the photodetector 15. The observation optical system 13A may be configured to be combined with the marking optical system 13B to be described below or may be configured separately from the marking optical system 13B. The observation optical system 13A irradiates the semiconductor device D with the light output from the light source 12 from the substrate side of the semiconductor device D, that is, the back surface D1 side of the semiconductor device D. For example, the observation optical system 13A includes a beam splitter and an objective lens. The objective lens converges the light output from the light source 12 and guided by the beam splitter to an observation area. For example, the observation optical system 13A is placed on the XYZ stage 14. The XYZ stage 14 is movable in a Z-axis direction, and an X-axis direction and a Y-axis direction orthogonal to the Z-axis direction when an optical axis direction of the objective lens is the Z-axis direction. The XYZ stage 14 is movable in the three axis directions described above by being controlled by a control unit 21b (to be described below) of the computer 21. The observation area is determined by a position of the XYZ stage 14.

The observation optical system 13A transfers light (reflected light) transmitted through the substrate of the semiconductor device D and reflected by the semiconductor device D in accordance with illumination light to the photodetector 15. Specifically, the light radiated from the observation optical system 13A is transmitted through the substrate SiE (see FIG. 4) of the semiconductor device D and is reflected by the metal layer ME (see FIG. 4). The light reflected by the metal layer ME is transmitted through the substrate SiE again and input to the photodetector 15 via the objective lens and the beam splitter of the observation optical system 13A. In addition, the observation optical system 13A transfers the light generated in the semiconductor device D due to the application of the stimulation signal to the photodetector 15. Specifically, light (for example, emission light) generated in the metal layer ME of the semiconductor device D mainly due to the application of the stimulation signal is transmitted through the substrate SiE and is input to the photodetector 15 via the objective lens and the beam splitter of the observation optical system 13A.

The photodetector 15 images the light from the semiconductor device D and outputs image data (a detection signal). For example, the photodetector 15 images light reflected from the semiconductor device D, and outputs image data for generating a pattern image. It is possible to ascertain a marking position on the basis of the pattern image. Further, the photodetector 15 images the emission light from the semiconductor device D and outputs image data for generating an emission image. An emission point in the semiconductor device D can be specified on the basis of the emission image. It is possible to specify the fault point of the semiconductor device D by specifying the emission point. For example, a camera in which a charge coupled device (CCD) image sensor or a complementary metal oxide semiconductor (CMOS) image sensor capable of detecting light having a wavelength transmitted through the substrate SiE of the semiconductor device D is mounted, an InGaAs camera, or a two-dimensional camera such as an MCT camera is used as the photodetector 15 that measures the emission light.

The computer 21 is electrically connected to the photodetector 15 or the like via a cable. The computer 21 is, for example, a computer including a processor (CPU: Central Processing Unit), a random access memory (RAM), a read only memory (ROM), a solid state drive (SSD), a hard disk drive (HDD) that are storage media, and the like. The computer 21 executes a process of the processor for data stored in the storage medium. The computer 21 generates a pattern image and an emission image on the basis of the image data input from the photodetector 15. The pattern image is an image captured so that a circuit (for example, a circuit pattern formed on the metal layer ME) of the semiconductor device D can be confirmed. It should be noted that a cloud server, a smart device (for example, a smartphone or a tablet terminal), a microcomputer, a field-programmable gate array (FPGA), or the like may be used for the computer 21.

As illustrated in FIG. 2, the computer 21 acquires pattern images of respective magnifications from a low magnification to a high magnification with respect to a portion including an emission point in the semiconductor device D. A portion (a) of FIG. 2 illustrates a pattern image A1 with a low magnification, a portion (b) of FIG. 2 illustrates a pattern image A2 with a medium magnification, and a portion (c) of FIG. 2 illustrates a pattern image A3 with a high magnification. For example, the computer 21 can acquire the pattern images A1 to A3 according to the respective magnifications by controlling the objective lens of the observation optical system 13A.

Here, it is difficult to specify the emission position in the pattern (a circuit pattern or the like) of the semiconductor device D with only the emission image described above. Therefore, the computer 21 generates, as an analysis image, a superimposed image in which the pattern image generated as described above and the emission image based on the emission light from the semiconductor device D are superimposed. A portion (a) of FIG. 3 illustrates an analysis image A4 in which the pattern image A3 with a high magnification and an emission image showing the fault point fp which is an emission point are superimposed.

The computer 21 outputs the analysis image A4 to the display unit 22. The display unit 22 is a display device such as a display for showing the analysis image A4 or the like to the user. The display unit 22 displays the input analysis image A4. In this case, a user confirms the position of the fault point fp from the analysis image A4 displayed on the display unit 22, and inputs information indicating the fault point fp to the input unit 23. The input unit 23 is an input device such as a keyboard and a mouse that receive an input from the user. The input unit 23 outputs information indicating the fault point fp received from the user to the computer 21. The computer 21, the display unit 22, and the input unit 23 may form a tablet terminal. The above is a description of a functional configuration of the inspection device 1 related to the fault point specifying process.

Next, a functional configuration of the inspection device 1 related to the marking process will be described. The marking process is a process of performing marking indicating a fault point fp specified through the fault point specifying process, around the fault point fp.

The inspection device 1 further includes a laser light source 16 and a marking optical system 13B, in addition to the respective functional configurations related to the fault point specifying process described above, as a functional configuration related to the marking process. Further, the computer 21 includes a condition setting unit 21a, a control unit 21b (a marking control unit), and an analysis unit 21c (a processing unit).

In the marking process, laser marking is performed on the basis of the fault point fp (predetermined position) specified in the fault point specifying process. As illustrated in a portion (b) of FIG. 3 and FIG. 4, a marking point mp is set around the fault point fp (here, four points in this example). In the marking process, the marking point mp of the semiconductor device D is irradiated with the laser light output by the laser light source 16 via the marking optical system 13B. That is, the marking point mp is irradiated from the substrate SiE side of the semiconductor device D) with laser light having a wavelength that is transmitted through the substrate SiE. Accordingly, a marking is formed at a boundary between the substrate SiE and the metal layer ME. Hereinafter, a functional configuration of the inspection device 1 related to the marking processing will be described in detail.

The condition setting unit 21a sets the marking point mp on the basis of information indicating the fault point fp input from the input unit 23. The marking points mp may be set at several points around the specified fault point fp. The several points are, for example, four points. For example, when information indicating the fault point fp is input, the condition setting unit 21a automatically sets the marking points mp around the fault point fp at four points around the fault point fp. Specifically, for example, in a plan view, the marking points mp may be set in a cross shape around the failure portion fp. It should be noted that the marking point mp may be set by the input unit 23 receiving an input of information indicating the marking point mp from the user who has viewed the analysis image displayed on the display unit 22. In this case, the condition setting unit 21a sets the marking point mp on the basis of the information indicating the marking point mp input from the input unit 23 instead of automatically setting the marking point mp. The condition setting unit 21a generates a reference image A5 (see a portion (b) of FIG. 3) in which marks indicating the fault point fp and the marking point mp are added to the analysis image A4, and stores the reference image A5 in the computer 21.

The control unit 21b of the computer 21 moves the XYZ stage 14 in three axis directions by controlling the XYZ stage 14. Specifically, the control unit 21b moves the XYZ stage 14 on which the marking optical system 13B is placed so that laser marking is performed on the marking point mp set by the condition setting unit 21a. When there are a plurality of marking points mp, the control unit 21b performs control so that laser marking is sequentially performed on all the marking points mp. That is, when the laser marking at one marking point mp is completed, the control unit 21b moves the XYZ stage 14 so that laser marking of the next marking point mp is performed. When the movement of the XYZ stage 14 is completed, the control unit 21b outputs an output start signal to the laser light source 16.

The laser light source 16 is operated by a power supply (not illustrated), and outputs laser light with which the semiconductor device D is irradiated. When the output start signal is input by the control unit 21b, the laser light source 16 starts output of laser light. As the laser light source 16, for example, a semiconductor laser or a fiber laser can be used. A wavelength of the laser light output from the laser light source 16 may be in any wavelength range that is transmitted through the substrate SiE. For example, when the substrate SiE is silicon, the wavelength is preferably 1064 nm or more.

The marking optical system 13B irradiates the marking point mp of the semiconductor device D from the substrate SiE side of the semiconductor device D, that is, the back surface D1 side of the semiconductor device D with the laser light output from the laser light source 16. The marking optical system 13B has an objective lens.

The objective lens condenses the laser light from the laser light source 16 at the marking point mp. The marking optical system 13B is placed on the XYZ stage 14. The XYZ stage 14 is controlled by the control unit 21b to be movable in the three axis directions described. It is to be noted that the marking optical system 13B may include an optical scanning unit (for example, an optical scanning element such as a galvanometer mirror, a polygon mirror, and an MEMS mirror) instead of the XYZ stage 14 described above, as a configuration for changing the irradiation position of the laser light. In this case, the control unit 21b can control the irradiation position of the laser light by controlling an operation of the optical scanning unit. Further, the marking optical system 13B may include a shutter, and the shutter may be operated under the control of the control unit 21b to pass or block the laser light from the laser light source 16 such that the output of the laser light is controlled.

The control unit 21b is electrically connected to the laser light source 16 and controls irradiation with laser light in laser marking. Specifically, the control unit 21b controls the output of the laser light source 16 so that the marking is formed at the boundary between the substrate SiE and the metal layer ME. Preferably, the control unit 21b controls the output of the laser light source 16 so that the marking does not penetrate through the metal layer ME. Accordingly, the marking can be kept inside the semiconductor device D. As a result, it is possible to prevent the front surface D2 of the semiconductor device D from being contaminated due to debris of the semiconductor device that may be generated at the time of marking formation. For example, the control unit 21b performs control so that the power of the laser light in laser marking becomes 10 µJ to 10 mJ. In a case in which the laser light output from the laser light source 16 is a pulse laser, the control unit 21b may define the number of irradiations of the marking point mp with the laser pulse (for example, 50 to 1000 shots) as an irradiation condition of the laser light, thereby controlling the irradiation of the laser light. Further, in a case in which the laser light output from the laser light source 16 is a continuous wave laser (CW laser), the control unit 21b may define a time to irradiate the marking point mp with the laser light as an irradiation condition of the laser light, thereby controlling the irradiation of the laser light.

When the irradiation with the laser light on the basis of the irradiation conditions defined as described above is completed, the control unit 21b outputs an output stop signal to the laser light source 16. When the output stop signal is input, the laser light source 16 stops the output of the laser light. Therefore, the laser light source 16 outputs the laser light from a point of time that the output start signal is input from the control unit 21b to a point of time that the output stop signal is input from the control unit 21b.

The marking formed due to the irradiation with the laser light may be a marking that can be confirmed by the photodetector 15 or the like, and various forms are conceivable. Examples of the marking may include cavities generated due to the irradiation with the laser light, amorphousness generated due to reforming, and a part of the metal layer ME or the substrate SiE melted by heat generated due to laser light absorbed by the metal layer ME.

After it is confirmed that the marking is appropriately formed at one marking point mp, the control unit 21b performs control so that laser marking of the next marking point mp is started. For example, the control unit 21b stops the output of the laser light source 16 after laser marking at one marking point mp (that is, irradiation with the laser light based on the set irradiation conditions of the laser light) is completed, performs switching from the marking optical system 13B to the observation optical system 13A, and starts the output of the light source 12. Accordingly, the photodetector 15 images the light from the light source 12 reflected from the semiconductor device D, and outputs the image data (the detection signal) described above to the analysis unit 21c of the computer 21. The analysis unit 21c generates a pattern image on the basis of the image data. Here, when a marking having an appropriate size is not formed at the marking point mp (when the marking is small), a change in intensity of the reflected light at the marking point mp is small and a change in the optical reflection image is small. Therefore, an influence of the laser marking on the pattern image is small. On the other hand, when a marking having an appropriate size is formed at the marking point mp, a change in at least one of a refractive index, a transmittance, an absorptivity, and a reflectance of light becomes large. As a result, the change in intensity of the reflected light at the marking point mp becomes large, and a mark image showing the marking formed at the marking point mp appears on the pattern image.

For example, the analysis unit 21c compares the pattern image (for example, the pattern image A3) acquired before the laser marking with the pattern image acquired after the laser marking and determines whether a difference between the images is equal to or larger than a predetermined defined value. When the difference between the images is equal to or larger than the defined value (or larger than the defined value), the analysis unit 21c determines that the mark image has appeared (that is, a marking having an appropriate size has been formed). On the other hand, when the difference between the images is smaller than the defined value (or equal to or smaller than the defined value), the analysis unit 21c determines that the mark image has not appeared (that is, the marking having an appropriate size has not been formed).

When the analysis unit 21c determines that the mark image has appeared, the control unit 21b records that the laser marking at the marking point mp is completed. The control unit 21b determines whether or not scheduled laser marking of all marking points mp (for example, four places in the embodiment) has been completed. When the laser marking of all the marking points mp has been completed, the control unit 21b completes the laser marking process. On the other hand, when marking points mp that have not been marked remain, the control unit 21b performs control so that the laser marking of the next marking point mp is started.

On the other hand, when the analysis unit 21c determines that the mark image has not appeared, the control unit 21b performs control so that the laser marking at the marking point mp is executed again. In this case, the control unit 21b sets irradiation conditions of the laser light output from the laser light source 16 in accordance with a size of the mark image (that is, a magnitude of the difference between the images) detected by the analysis unit 21c. That is, the control unit 21b calculates a necessary additional amount of irradiation with the laser light to form a marking having a predetermined size in accordance with a size of the marking that has already been formed, and may set irradiation conditions in accordance with the amount of irradiation.

It should be noted that the determination in the analysis unit 21O described above may be executed by manual operation of the user. For example, the analysis unit 21c may determine whether or not the mark image has appeared depending on input content from the user. In this case, the pattern image is displayed on the display unit 22. Information on whether or not the mark image has appeared on the pattern image is input to the input unit 23 by the user who visually confirms the pattern image. The input unit 23 outputs information indicating whether or not the mark image has appeared to the computer 21. The analysis unit 21c determines whether or not the mark image has appeared on the basis of information indicating whether or not the mark image has appeared.

Further, when it is determined that the mark image has appeared, the analysis unit 21c compares the reference image A5 with the pattern image acquired after laser marking. When a point at which the mark has been formed in the pattern image deviates from the marking point mp in the reference image A5, the analysis unit 21c determines that a mark formation deviation occurs. In this case, control for correcting the marking point mp may be executed as follows. For example, the analysis unit 21c notifies the control unit 21b of information on the mark formation deviation (for example, a direction of the deviation and a magnitude of the deviation). The control unit 21b may perform position correction by moving the XYZ stage 14 so that a mark is formed at the correct marking position mp on the basis of the information.

After the laser marking onto all the marking points mp has been completed as described above, the control unit 21b operates the light source 12, the observation optical system 13A, and the photodetector 15. Accordingly, the photodetector 15 images the light from the light source 12 reflected from the semiconductor device D, and outputs image data (a detection signal) to the analysis unit 21c of the computer 21. The analysis unit 21c generates a pattern image after laser marking (a pattern image including a mark image) on the basis of the image data.

As illustrated in FIG. 5, the analysis unit 21c can generate a marking image A6 in which the mark image m and the fault point fp can be specified, by superimposing the emission image on the pattern image including the mark image. Here, the marking image A6 is an image generated with the same magnification as the pattern image A3 with a low magnification. The analysis unit 21c can acquire the marking position information indicating a relative position of each mark image m with reference to the feature point P0 of the semiconductor device D by superimposing the marking image A6 and the pattern image A1 with a high magnification on each other. For example, the analysis unit 21c can calculate a coordinate position of each mark image m when the coordinate position of the feature point P0 is set as an origin position on the basis of the image generated by superimposing the marking image A6 and the pattern image A1 on each other as described above.

It should be noted that as described above, the laser marking is controlled so that the marking is formed at the marking point mp, and the position of the mark image m and the position of the marking point mp are matched with each other. Therefore, when accuracy of the marking position by the laser marking is high (when an error between the position of the mark image m and the position of the marking position mp is small), the analysis unit 21c may calculate the coordinate position of each marking point mp when the coordinate position of the feature point P0 is set as an origin position, on the basis of the image obtained by superimposing the pattern image A1 and the reference image A5 on each other.

Further, it is also preferable for the feature point P0 to be a point indicating a feature pattern that can be specified not only from the back surface D1 side of the semiconductor device D but also from the front surface D2 side. In this case, even when physical analysis is performed on the semiconductor device D from the front surface D2 side, it is possible to easily specify the positions of the mark image m and the fault point fp on the basis of the feature point P0. An example of such a feature point P0 may be a corner portion of a memory mat.

The analysis unit 21c stores the marking position information of the mark image m (or the marking point mp) calculated as described above in the storage medium included in the computer 21. It should be noted that the analysis unit 21c may output the marking position information to a recording medium (for example, a USB memory) removable from the computer 21 or may output the marking position information to an external computer device via a wired or wireless communication network. Further, the analysis unit 21c may output the marking position information to the display unit 22. In this case, the display unit 22 may display the marking position information as a list or may display the marking position information together with the marking image. Further, these pieces of information may be output on a paper medium by an external device such as a printer or the like.

Next, an example of an operation of the inspection device 1 from specify of a fault point to output of marking position information will be described with reference to FIG. 6.

First, the inspection device 1 inspects the semiconductor device D by executing the fault point specifying process described above, and specifies the fault point fp in the semiconductor device D (step S1). Specifically, the inspection device 1 controls the XYZ stage 14 so that a field of view of the observation optical system 13A is located in an area to be observed. The inspection device 1 controls the XYZ stage 14 so that a focus of the objective lens matches the area to be observed. When the field of view of the observation optical system 13A is located in the area to be observed, the inspection device 1 irradiates the semiconductor device D with the light output from the light source 12 from the back surface D1 side of the semiconductor device D by the observation optical system 13A, and acquires the optical reflection image generated by the photodetector 15. Subsequently, the inspection device 1 applies a stimulation signal to the semiconductor device D using the stimulation device 11, and acquires an emission image using the photodetector 15. The inspection device 1 superimposes the acquired optical reflection image and the emission image on each other to generate the analysis image A4 (see a portion (a) of FIG. 3), and specifies the fault point fp on the basis of the analysis image A4.

Subsequently, the marking point mp is set in accordance with the position of the fault point fp, and a reference image A5 is generated by adding a mark indicating the fault point fp and the marking point mp to the analysis image A4. The control unit 21b of the computer 21 moves the XYZ stage 14 to a position in accordance with the marking point mp. Accordingly, the marking optical system 13B placed on the XYZ stage 14 moves to an appropriate position in accordance with the marking point mp (step S2).

Subsequently, the control unit 216b irradiates the semiconductor device D with laser light having a wavelength that is transmitted through the substrate SiE from the substrate SiE side so that a marking is formed at the boundary between the substrate SiE and the metal layer ME at the marking point nip. Specifically, the control unit 21b controls the output of the laser light source 16 on the basis of the laser light irradiation condition set in advance as described above, thereby executing the irradiation of the marking point mp with the laser light (step S3). When the irradiation with the laser light based on the irradiation condition described above is completed in step S3, the control unit 21b stops the output of the laser light source 16, performs switching from the marking optical system 13B to the observation optical system 13A, and starts the output of the light source 12. Accordingly, the photodetector 15 images the light from the light source 12 reflected from the semiconductor device D, and outputs the image data (the detection signal) described above to the analysis unit 21c of the computer 21. The analysis unit 21c generates a pattern image on the basis of the image data.

Subsequently, the analysis unit 21c determines whether or not the mark image has appeared on the pattern image (step S4). When it is determined that no mark image has appeared on the pattern image (step S4: NO), the process of step S3 is executed again. On the other hand, when it is determined that the mark image has appeared on the pattern image (step S4: YES), the control unit 21b determines whether or not the marking point mp in which laser marking is not performed remains (step S5). When it is determined that a marking point mp at which laser marking is not performed remains (step S5: YES), the process of step S2 is executed for the remaining marking point mp. On the other hand, when it is determined that there is no marking point mp at which laser marking is not performed (that is, laser marking at all marking points mp has been completed) (step S5: NO), the laser marking process is completed.

Subsequently, the analysis unit 21c records the marking position information (step S6). Specifically, the analysis unit 21c generates the marking image A6 (see FIG. 5) which is a pattern image (a pattern image including a mark image) after completion of laser marking. Further, the analysis unit 21c calculates a coordinate position of each mark image m when the coordinate position of the feature point P0 is set as an origin position on the basis of the image (see FIG. 5) generated by superimposing the marking image A6 and the pattern image A1. Accordingly, information indicating a relative position with respect to the feature point P0 of each mark image m is obtained as marking position information for specifying a position of the marking. The analysis unit 21c stores the marking position information obtained thus in the storage medium included in the computer 21.

Subsequently, the analysis unit 21c outputs the marking position information (step S7). Specifically, the analysis unit 21c may output the marking position information to a portable recording medium such as a USB memory as described above or may output the marking position information to an external computer device (for example, an analysis device that performs physical analysis of the semiconductor device D).

Next, examples of a structure of the semiconductor device D and a place at which a marking M is formed in each example will be described with reference to FIGS. 7 and 8. A portion (a) of FIG. 7 illustrates a schematic cross section of a semiconductor device 100 which is a logic device, a portion (b) of FIG. 7 illustrates a schematic cross section of a semiconductor device 200 which is a memory device, and a portion (a) of FIG. 8 illustrates a schematic cross section of a semiconductor device 300 which is a power device. Each of the semiconductor devices 100, 200, and 300 includes a transistor layer T at a boundary between a metal layer ME and a substrate SiE. The transistor layer T includes a circuit element (for example, a gate element) embedded in at least one of the metal layer ME and the substrate SiE at the boundary between the metal layer ME and the substrate SiE. In addition, the metal layer ME includes a wiring layer provided with a wiring W electrically connected to the transistor layer T on the front surface D2 side relative to the transistor layer T. As illustrated in FIGS. 7 and 8, the marking M is formed mainly in the transistor layer T located at the boundary between the substrate SiE and the wiring layer using the laser marking described above.

Here, as illustrated in FIGS. 8 and 9, the substrate SiE may be thinned and the semiconductor device D may be observed from the thinned substrate SiE side (the back surface D1 side) in physical analysis after laser marking. Here, FIG. 9 is a view illustrating a state after the substrate SiE of the semiconductor device 300 illustrated in FIG. 8 is thinned. As described above, the marking M is formed in the transistor layer T which is the boundary between the substrate SiE and the metal layer ME. Therefore, it is possible to easily confirm the marking M from the back surface D1 side (see a portion (b) of FIG. 9) using an electron beam (EB) or the like by thinning the substrate SiE by abrading the substrate SiE from the back surface D1 side. Accordingly, it is possible to accurately perform the physical analysis on the basis of a position of the marking. It should be noted that, in this example, a thickness d1 of the substrate SiE before thinning is about 100 µm to 700 µm, and a thickness d2 of the substrate SiE after thinning is about 10 µm. Further, when the substrate SiE is thinned to the thickness d2 of about 1 µm, the marking M is likely to be confirmed using visible light.

FIG. 10 is a view illustrating an example of an SEM image showing the marking M formed between the substrate and the metal layer of the semiconductor device that is a flash memory (a memory device) using the inspection method that is executed by the inspection device 1. A portion (a) of FIG. 10 illustrates an image with a low magnification (magnification: 30000) obtained by imaging a cross-sectional portion including the marking M in the semiconductor device using a scanning electron microscope (SEM). A portion (b) of FIG. 10 illustrates an image with a high magnification (magnification: 60000) obtained by imaging the cross-sectional portion including the marking M in the semiconductor device using the SEM.

Next, effects of the inspection device 1 and the inspection method that is executed by the inspection device 1 will be described.

In the inspection device 1 and the inspection method, the semiconductor device D is irradiated with laser light having a wavelength transmitted through the substrate SiE from the substrate SiE side so that a marking is formed at least at the boundary between the substrate SiE and the metal layer ME on the basis of the fault point fp (a predetermined position) specified in the semiconductor device D. It is possible to form the marking at a position at which the marking can be easily confirmed from both the front surface D2 side (the metal layer ME side) and the back surface D1 side (the substrate SiE side) by forming the marking at the boundary between the substrate SiE and the metal layer ME. Accordingly, when laser marking is performed from the substrate SiE side of the semiconductor device D, it is possible to easily confirm the marking position from both the front surface D2 side and the back surface DL side at the time of physical analysis.

Further, the control unit 21b controls the output of the laser light source 16 so that the marking does not penetrate through the metal layer ME. Accordingly, the marking can be kept inside the semiconductor device D. As a result, it is possible to prevent the front surface D2 of the semiconductor device D from being contaminated due to debris of the semiconductor device D that may be generated at the time of marking formation. Further, the control unit 21b controls the output of the laser light source so that at least one of cavities, reforming, and melting is generated as the marking. Thus, the marking can be appropriately formed.

Further, the inspection device 1 includes the analysis unit 21c that acquires a pattern image (for example, the marking image A6 described above) of the semiconductor device D including the mark image m indicating the marking on the basis of the detection signal. Accordingly, it is possible to acquire a pattern image from which the marking position can be visually ascertained together with the pattern (for example, a wiring pattern) of the semiconductor device D. With such a pattern image, it becomes possible to easily ascertain the marking position in the physical analysis.

The analysis unit 21c acquires marking position information for specifying the position of the marking on the basis of the pattern image, and outputs the marking position information. Accordingly, it is possible to output the marking position information for specifying the marking position in the physical analysis to an external device or the like. Therefore, for example, even in a case in which the inspection device 1 that performs marking and the analysis device that performs physical analysis are disposed in different places, it is possible to appropriately transfer the marking position information necessary to perform physical analysis to the analysis device.

The analysis unit 21c acquires information indicating the relative position of the marking with reference to the feature point P0 of the semiconductor device D as the marking position information. It becomes possible to accurately ascertain the position of the marking by using the relative position of the marking with respect to the position of the feature point P0 (for example, a groove portion of the wiring pattern) of the semiconductor device D as the marking position information in this way.

Although the embodiment of the present invention has been described above, the present invention is not limited to the above embodiment. For example, in the above embodiment, the marking is formed at the fault point fp of the semiconductor device D specified by inspecting the semiconductor device D, but the position at which the marking is formed is not limited to the fault point fp. That is, in the inspection device 1, the semiconductor device D may be irradiated with laser light having a wavelength transmitted through the substrate SiE from the substrate SiE side so that the marking is formed at least at the boundary between the substrate SiE and the metal layer ME with respect to a predetermined position of the semiconductor device D. With such a configuration, a marking forming method for performing laser marking on the semiconductor device D having the substrate SiE and the metal layer ME formed on the substrate SiE is realized. Further, in the inspection device 1, configurations of Modification example 1 to Modification example 4 to be described below may be adopted.

Modification Example 1

The inspection device 1 may include an infrared camera instead of the two-dimensional camera described above, as the photodetector 15. In this case, the inspection device 1 may not include the light source 12. In addition, since the light source 12 is not included, the observation optical system 13A may not include the beam splitter. The infrared camera images heat rays from the semiconductor device D to generate a measurement image. It is possible to specify a heat generation place in the semiconductor device D using an infrared image in accordance with the measurement image. It is possible to specify the fault point of the semiconductor device D by specifying the heat generation place. In a case in which the heat rays are measured, an InSb camera or the like is used as an infrared camera. It should be noted that the heat rays are light having a wavelength of 2 µm to 10 µm. Further, it is possible to acquire an image showing a distribution of emissivity of the semiconductor device D by imaging the heat rays from the semiconductor device D.

In Modification example 1, the analysis unit 21c of the computer 21 generates an infrared image on the basis of the measurement image described above. Further, the analysis unit 21c generates a pattern image on the basis of the detection signal. The analysis unit 21c generates a superimposed image in which the infrared image is superimposed on the pattern image, as an analysis image. A process of specifying the fault point from the analysis image is the same as in the above embodiment.

A procedure of measuring the heat rays from the semiconductor device D using the infrared camera and generating the infrared image in the analysis unit 21c will be described in detail. First, in a state in which a stimulation signal such as a test pattern is being applied by the stimulation device 11, a first measurement image including heat generation of the semiconductor device D is acquired by the infrared camera. This first measurement image is generated by a plurality of pieces of image data continuously captured in a predetermined exposure time being transmitted to the computer 21 and added by the analysis unit 21c. The first measurement image has both the heat generation of the semiconductor device D and information on shapes of elements forming the semiconductor device D. Then, in a state in which the application of the stimulation signal by the stimulation device 11 is stopped, a second measurement image including only the information on the shapes of the elements forming the semiconductor device D is acquired by the infrared camera. The second measurement image is generated by a plurality of pieces of image data continuously captured in a predetermined exposure time being transmitted to the computer 21 and added by the analysis unit 21c, similar to the first measurement image. The second measurement image has only the information on the shapes of the elements forming the semiconductor device D. The analysis unit 21c performs a process of subtracting the second measurement image from the first measurement image to generate an infrared image including only the heat generation of the semiconductor device D. The analysis unit 21c generates the second measurement image as the pattern image using a superimposed image obtained by superimposing the infrared image on the second measurement image or the first measurement image as the analysis image. The process of specifying the fault point from the analysis image is the same as in the above embodiment.

In the process of confirming the presence or absence of a mark image after laser marking, the observation optical system 13A transmits the heat rays from the semiconductor device D to the infrared camera. The infrared camera detects the heat rays and outputs image data (a detection signal) to the computer 21. The analysis unit 21c generates a pattern image based on the image data, as described above. A process after the pattern image is generated is the same as in the embodiment described above.

Modification Example 2

The inspection device 1 may include a power supply that is electrically connected to the semiconductor device D and applies a voltage to the semiconductor device D, as the stimulation device 11. In addition, the light output from the light source 12 may be coherent light such as laser light. As the light source 12 that outputs coherent light, a solid laser light source, a semiconductor laser light source, or the like can be used. In a case in which an optical beam induced resistance change (OBIRCH) image, a soft defect localization (SDL) image, and the like are acquired, the light source 12 outputs laser light in a wavelength range in which the semiconductor device D does not generate charge (carriers). For example, in a case in which the substrate SiE is made of silicon, the light source 12 outputs laser light having a wavelength range greater than 1200 nm and, preferably, about 1300 nm. Further, in a case in which the OBIC image, a Laser assisted device alteration (LADA) image, and the like is acquired, the light source 12 is required to output light in a wavelength range in which the semiconductor device D generates charge (carriers), and therefore, the light source 12 outputs light having a wavelength range of 1200 nm or less (for example, laser light having a wavelength range of about 1064 nm). The light output from the light source 12 may be incoherent light. As the light source 12 that outputs incoherent light, a super luminescent diode (SLD), an amplified spontaneous emission (ASE), a light emitting diode (LED), or the like can be used. The light output from the light source 12 is guided to the observation optical system 13A via a polarization preserving single mode optical coupler and a polarization preserving single mode optical fiber for probe light, and irradiated on the semiconductor device D. In Modification example 2, the observation optical system 13A includes an optical scanning unit and an objective lens. The optical scanning unit scans an irradiation spot on the back surface D1 of the semiconductor device D. The optical scanning unit includes, for example, optical scanning elements such as a galvanometer mirror, a polygon mirror, and an MEMS mirror. The objective lens condenses the light guided by the optical scanning unit onto the irradiation spot.

In Modification example 2, the inspection device 1 may include an electric signal detector electrically connected to the semiconductor device D. The electric signal detector detects an electric signal generated in the semiconductor device D in accordance with laser light. The electric signal detector outputs an electric signal feature value in accordance with the detected electric signal to the computer 21. Further, in Modification example 2, the photodetector 15 may include an optical sensor. The optical sensor detects reflected light of the semiconductor device D in accordance with the laser light and outputs a detection signal to the computer 21. The optical sensor is, for example, a photodiode, an avalanche photodiode, a photomultiplier tube, an area image sensor.

The analysis unit 21c of the computer 21 generates an electric signal image converted from the electric signal feature value in association with a scanning position of the laser light in accordance with the optical scanning unit that is controlled by the control unit 21b. Further, the analysis unit 21c generates an optical reflection image on the basis of the detection signal. The analysis unit 21c generates a superimposed image obtained by superimposing the electric signal image on the optical reflection image, as the analysis image. A process of specifying the fault point from the analysis image is the same as in the embodiment described above.

The electric signal image is, for example, an OBIC image which is a photovoltaic current image, an OBIRCH image which is an electric quantity change image, an SDL image which is an errata information image, and an LADA image. The OBIC image is an image obtained by detecting a photovoltaic current generated due to laser irradiation and converting a current value or a current change value of the photovoltaic current into an image as an electric signal feature value. The OBIRCH image is an image obtained by changing a resistance value at an irradiation position in the semiconductor device D through laser irradiation in a state in which a constant current is applied to the semiconductor device D and converting a voltage value or a change value of a voltage in accordance with the change in the resistance value as an electric signal feature value into an image. It should be noted that the OBIRCH image may be an image obtained by changing a resistance value at an irradiation position in the semiconductor device D through laser irradiation in a state in which a constant voltage is applied to the semiconductor device D and converting a change value of a current in accordance with the change in the resistance value as an electric signal feature value into an image. The SDL image is an image obtained by detecting a malfunction state by irradiating the semiconductor device D with a laser having a wavelength at which carriers are not excited in a state in which a stimulation signal such as a test pattern is applied to the semiconductor device D, converting information on the malfunction state (for example, a PASS/FAIL signal) as an electric signal feature value into a luminance count, and converting the luminance count into an information image. The LADA image is an image obtained by detecting a malfunction state by irradiating the semiconductor device D with a laser having a wavelength at which carriers are excited in a state in which a stimulation signal such as a test pattern is applied to the semiconductor device D, converting information on the malfunction state (for example, a PASS/FAIL signal) as an electric signal feature value into a luminance count, and converting the luminance count into an information image.

In the process of confirming the presence or absence of a mark image after laser marking, the light source 12 outputs light with which the back surface D1 side of the semiconductor device D is irradiated. The observation optical system 13A irradiates the back surface D1 of the semiconductor device D with the light output from the light source 12. The observation optical system 13A transfers reflected light from the semiconductor device D in accordance with the irradiated light to the photodetector 15 which is an optical sensor. The optical sensor detects the reflected light and outputs a detection signal to the computer 21. The analysis unit 21c generates a pattern image which is an optical reflection image based on the detection signal. A process after the pattern image is generated is the same as in the embodiment described above.

Modification Example 3

The inspection device 1 may specify a fault position using an optical probing technique called EOP or electro-optical frequency mapping (EOFM).

In Modification example 3, the semiconductor device D is scanned with the light from the light source 12, and the reflected light from the semiconductor device D is detected by the photodetector 15 which is an optical sensor. The reflected, light is output to the computer 21, and an optical reflection image is generated by the analysis unit 21c. Then, in a state in which a stimulation signal such as a test pattern is repeatedly applied from the stimulation device 11 to the semiconductor device D, an irradiation spot selected by a user on the basis of the optical reflection image displayed on the display unit 22 and input by the input unit 23 is irradiated with the light output from the light source 12. A wavelength of the light output from the light source 12 is, for example, 530 nm or more and, preferably, 1064 nm or more. The reflected light modulated in accordance with an operation of elements in the semiconductor device D is detected by the optical sensor and output to the computer 21 as a detection signal. In the analysis unit 21c, a signal waveform is generated on the basis of the detection signal, and displayed on the display unit 22. The optical reflection image described above can be used as an analysis image by looking for the fault point from the signal waveform observed while changing the irradiation spot on the basis of the optical reflection image described above.

Further, the analysis unit 21c may generate an electrooptic frequency mapping image (EOFM image) by converting phase difference information between the detection signal and the stimulation signal such as the test pattern into an image in association with an irradiation position. In this case, the phase difference information can be obtained from an AC component extracted from the detection signal. Further, the optical reflection image can be obtained by converting a DC component extracted simultaneously with the AC component into an image in association with the irradiation position. A superimposed image in which the EOFM image is superimposed on the optical reflection image can be used as an analysis image.

Modification Example 4

The inspection device 1 may specify the fault position using a magneto-optical probing technique. In this case, the inspection device 1 includes a magneto-optic crystal (MO crystal). In addition, the observation optical system 13A includes a light splitting optical system. The magnetooptical crystal is configured to be arbitrarily disposed with respect to the semiconductor device D. First, in the inspection device 1, it is possible to generate the optical reflection image as in Modification example 2 and Modification example 3 by performing switching to a configuration in which the magneto-optical crystal is not disposed between the objective lens and the semiconductor device D. Then, switching to a configuration in which the magneto-optical crystal is disposed between the objective lens and the semiconductor device D is performed, and the magnetooptical crystal is brought into contact with the semiconductor device D to which a stimulation signal such as a test pattern has been applied. The magneto-optic crystal is irradiated with the light from the light source 12 via the beam splitting optical system and the optical scanning unit, and reflected light is detected by the photodetector 15 which is an optical sensor. In the semiconductor device D, when a current flows due to the application of the stimulation signal such as a test pattern, a surrounding magnetic field changes and a polarization state of light reflected by the magnetooptic crystal changes. The light of which intensity has been changed in accordance with the change in the polarization state is input to the optical sensor via the light splitting optical system. Thus, the light of which the intensity has been changed in accordance with the change in the polarization state is detected by the optical sensor and output as the detection signal to the computer 21, thereby generating a magneto-optical image. A superimposed image in which the magneto-optical image is superimposed on the optical reflection image may be used as the analysis image.

REFERENCE SIGNS LIST

1 Inspection device
12 Light source
13A Observation optical system
13B Marking optical system
15 Photodetector
16 Laser light source
21b Control unit (marking control unit)
21c Analysis unit (processing unit)
D Semiconductor device
ME Metal layer
SiE Substrate

The invention claimed is:

1. An inspection method of performing laser marking on a semiconductor device including a substrate and a metal layer formed on the substrate, the inspection method comprising:
specifying a fault point in the semiconductor device by inspecting the semiconductor device;
irradiating the semiconductor device with a laser light having a wavelength that is transmitted through the substrate from a substrate side so that a plurality of markings is formed at least at a boundary between the substrate and the metal layer around the fault point;
imaging a reflected light from the semiconductor device having a wavelength that is transmitted through the substrate; and
confirming that each of the markings is formed.

2. The inspection method according to claim 1, wherein the irradiating the semiconductor device with the laser light includes controlling the irradiation with the laser light so that the each of the markings does not penetrate the metal layer.

3. The inspection method according to claim 1, wherein the irradiating the semiconductor device with the laser light includes controlling the irradiation with the laser light so that at least one of cavities, reforming, and melting is generated as the each of the markings.

4. The inspection method according to claim 1, further comprising acquiring a pattern image of the semiconductor device including a mark image indicating the each of the markings.

5. The inspection method according to claim 1, wherein the irradiating the semiconductor device with the laser light is performed after relatively moving a stage on which a marking optical system is placed with respect to the semiconductor device so that the laser marking is performed on a marking point.

6. The inspection method according to claim 1, wherein the irradiating the semiconductor device with the laser light includes controlling an irradiation position of the laser light by an optical scanner.

7. The inspection method according to claim 1, wherein, in the irradiating the semiconductor device with the laser light, four markings are formed in a cross shape around the fault point.

8. An inspection device that performs laser marking on a semiconductor device including a substrate and a metal layer formed on the substrate, the inspection device comprising:
a light source configured to output a light having a wavelength that is transmitted through the substrate;
an observation optical system configured to transfer light from a substrate side of the semiconductor device;
a photodetector configured to detect light from the semiconductor device via the observation optical system and output a detection signal;
a laser light source configured to output a laser light having a wavelength that is transmitted through the substrate;
a marking optical system configured to irradiate the semiconductor device with the laser light output by the laser light source from the substrate side;
a marking controller configured to control an output of the laser light source so that a plurality of markings is formed at least on a boundary between the substrate and the metal layer around a fault point that is specified on the basis of the detection signal; and
a display configured to display an image of the semiconductor device to confirm that each of the markings is formed.

9. The inspection device according to claim 8, wherein the marking controller controls the output of the laser light source so that the each of the markings does not penetrate through the metal layer.

10. The inspection device according to claim 8, wherein the marking controller controls the output of the laser light source so that at least one of cavities, reforming, and melting is generated as the each of the markings.

11. The inspection device according to claim 8, further comprising a processor configured to acquire a pattern image of the semiconductor device including a mark image indicating the each of the markings on the basis of the detection signal.

12. The inspection device according to claim 8, further comprising a stage configured to relatively move the marking optical system with respect to the semiconductor device so that the laser marking is performed on a marking point.

13. The inspection device according to claim 8, further comprising an optical scanner configured to change an irradiation position of the laser light.

14. The inspection device according to claim 8, wherein the marking controller is configured to control the laser light source and the marking optical system so that four markings are formed in a cross shape around the fault point.

* * * * *

UNITED STATES PATENT AND TRADEMARK OFFICE
CERTIFICATE OF CORRECTION

PATENT NO. : 10,923,404 B2
APPLICATION NO. : 16/742382
DATED : February 16, 2021
INVENTOR(S) : Shinsuke Suzuki et al.

It is certified that error appears in the above-identified patent and that said Letters Patent is hereby corrected as shown below:

In (72) Inventors:
"Shinsuke Suzuki, Hamamatsu (JP); Akira Shimase, Hamamatsu (JP)" should read
--Shinsuke Suzuki, Hamamatsu (JP); Akira Shimase, Hamamatsu (JP); Shinsuke Suzuki, Hamamatsu (JP)--.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*